(12) United States Patent
Hawe

(10) Patent No.: US 7,187,536 B2
(45) Date of Patent: Mar. 6, 2007

(54) STRUCTURE AND METHOD OF MAKING A CAPACITOR HAVING LOW EQUIVALENT SERIES RESISTANCE

(75) Inventor: Francis Edward Hawe, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/922,459

(22) Filed: Aug. 20, 2004

(65) Prior Publication Data

US 2005/0073802 A1    Apr. 7, 2005

Related U.S. Application Data

(60) Provisional application No. 60/498,445, filed on Aug. 28, 2003.

(51) Int. Cl.
*H01G 4/005* (2006.01)

(52) U.S. Cl. ............... 361/303; 361/302; 361/305; 361/301.3; 361/306.1; 361/313

(58) Field of Classification Search ............... 361/303, 361/305, 306.1, 306.3, 301.3, 311, 313, 302, 361/321.1, 321.5, 304, 312
See application file for complete search history.

(56) References Cited

U.S. PATENT DOCUMENTS

| | | | |
|---|---|---|---|
| 5,517,341 A | 5/1996 | Kim et al. | |
| 5,734,448 A | 3/1998 | Cheng | |
| 6,038,121 A * | 3/2000 | Naito et al. | 361/303 |
| 6,064,108 A | 5/2000 | Martinez | |
| 6,191,932 B1 * | 2/2001 | Kuroda et al. | 361/303 |
| 6,243,253 B1 * | 6/2001 | DuPre et al. | 361/306.3 |
| 6,370,011 B1 * | 4/2002 | Naito et al. | 361/306.1 |
| 6,417,535 B1 | 7/2002 | Johnson et al. | |
| 6,421,224 B1 * | 7/2002 | Lin et al. | 361/306.3 |
| 6,531,765 B2 | 3/2003 | Kinsman | |
| 6,646,860 B2 * | 11/2003 | Takaramoto et al. | 361/306.3 |
| 6,757,152 B2 * | 6/2004 | Galvagni et al. | 361/306.3 |
| 6,785,118 B1 * | 8/2004 | Liu et al. | 361/303 |

* cited by examiner

*Primary Examiner*—Nguyen T. Ha
(74) *Attorney, Agent, or Firm*—Lerner, David, Littenberg, Krumholz & Mentlik, LLP

(57) ABSTRACT

A structure and method are provided for reducing the equivalent series resistance of a capacitor. A capacitor includes one or more conductive interconnections contacting an active region of a first conductive plate of the capacitor at a plurality of locations along a lengthwise direction, such that every portion of the active region of the first conductive plate lies within a maximum distance from one of the locations, the maximum distance being less than the lateral dimension of the active region.

18 Claims, 8 Drawing Sheets

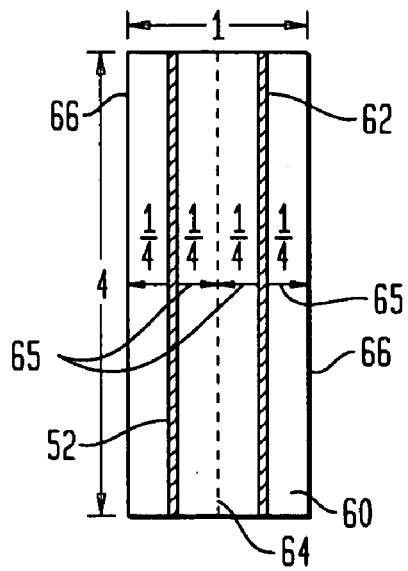
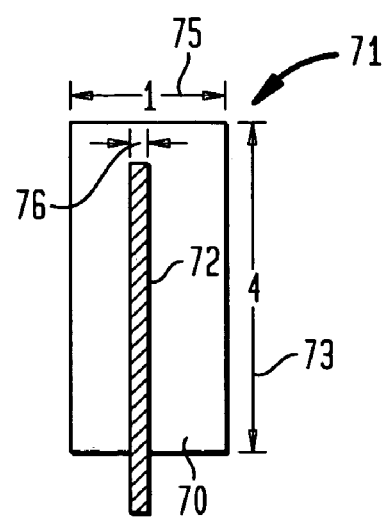
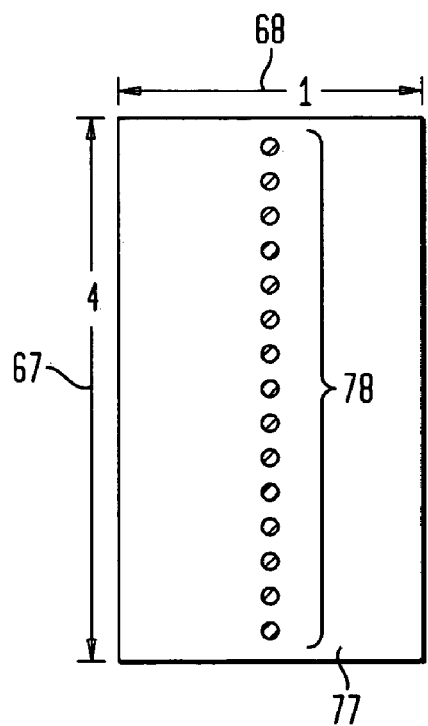

STRUCTURE AND METHOD OF MAKING A CAPACITOR HAVING LOW EQUIVALENT SERIES RESISTANCE

CROSS-REFERENCE TO RELATED APPLICATIONS

This application claims the benefit of the filing date of U.S. Provisional Patent Application No. 60/498,445 filed Aug. 28, 2003, the disclosure of which is hereby incorporated herein by reference.

BACKGROUND OF THE INVENTION

The present invention is related to capacitors.

As the speed of systems and circuits continues to increase, particularly of integrated circuits, associated packaging elements, and wiring of printed circuit panels to which they are attached, prior assumptions made concerning the behavior of certain circuit elements do not always hold true. At higher frequencies, the alternating current (AC) behavior of such circuit elements begins to predominate over that which is expected at lower frequencies.

At speeds that are currently being achieved not only within an integrated circuit ("IC" or "chip"), but off the chip as well, specific consideration must be given to the design and interconnection of circuit elements to maximize their performance at the frequencies they are expected to operate.

Particularly with respect to capacitors, prior assumptions about their behavior can lead to unsatisfactory results at high frequency. As shown in FIG. 1, a capacitor has an associated equivalent series resistance $R_{12}$ and an equivalent parallel resistance $R_{14}$, as well as an ideal capacitance $C_{12}$. At DC or low frequencies, the impedance of the capacitor due to these resistances $R_{12}$ and $R_{14}$ appears small in relation to the impedance due to the capacitance $C_{12}$, as such impedance is determined by the relation $Z(C)=1/j\omega C$. However, when operating at higher frequencies, the impedance due to the capacitance $Z(C)$ decreases, such that the resistances of $R_{12}$ and $R_{14}$ become proportionately larger.

With increasing frequency, not only does the impedance $Z(C)$ of the capacitor $C_{12}$ decrease, but the equivalent series resistance $R_{12}$ due to the resistance of the capacitor's conductive plates actually increases. All conductive materials, other than ideal superconductive materials, are known to have at least some resistivity. In addition to resistance which is apparent at a steady current DC, such resistivity arises from electromagnetic effects which can cause radiative as well as thermal losses.

Thus, in AC operation, certain dielectric materials used in a capacitor are known to cause thermal losses, in which the capacitor dissipates the energy of an electric field by heating. In general, dielectric materials having a high dielectric constant K, such as tantalum pentoxide and aluminum oxide, tend to cause higher thermal losses than dielectric materials which have lower dielectric constants. Moreover, the losses are more pronounced at higher frequencies. Referring to FIG. 1, such losses are manifested as a component of the resistance $R_{12}$ in series with the capacitor and the resistance $R_{14}$ in parallel with the capacitor.

Another factor contributing to equivalent series resistance is the skin effect. Skin effect is the tendency of AC currents to travel within the outermost layer of a conductor. As manifested by the skin effect, electromagnetic fields, and the resulting current density, decay exponentially in relation to the depth from the surface of a conductor. The higher the frequency, the more pronounced the skin effect becomes, leading to a shallower "skin depth" within which most of the AC current is conducted, and below which, comparatively little AC current is conducted.

The skin depth $\delta$ is defined by the relation:

$$\delta \equiv \frac{c}{\sqrt{2\pi\sigma\mu\omega}}.$$

In this equation, $\omega$ is the frequency, c is the speed of light in free space, $\sigma$ the conductivity of the conductor, and $\mu$ is the permeability of the conductor.

Thus, the skin depth $\delta$ is inversely proportional to the square root of the frequency $\omega$, the conductivity $\sigma$ and the permeability $\mu$ of the conductor. Hence, a better conductor has a smaller skin depth, and the skin depth decreases with frequency, i.e. varies inversely with frequency.

Resistance is related to skin depth in the following way. The resistance of an object, be it a conductor or otherwise, is defined as the inverse of its conductivity, i.e., the resistivity, multiplied by the length, and divided by the cross-sectional area of the object through which current passes; i.e. $R=\rho\times L/(Wt)$, wherein $\rho$ is the resistivity, L is the length of the conductor, and W and t are the width and thickness of the conductor defining the cross-sectional area, respectively. For higher frequencies, the skin depth is a measure of the effective thickness of the conductor at a particular frequency.

Shallower skin depth reduces the cross-sectional area through which currents pass within the conductor, as the current mostly passes within the skin depth. Since resistance is inversely related to the cross-sectional dimensions of the conductor, a conductor's resistance increases as the skin depth decreases at higher frequencies.

Sheet resistance Rs, measured in terms of ohms per square, is related to the resistance of an object by the particular geometry of the object through which the current passes. In any path capable of conducting a current, the resistance is equal to the sheet resistance times the ratio of the length of the path to the width of the path, i.e., $R=Rs\times(L/W)$ According to the above relation, the longer the distance the current must travel in a particular path, the higher the resistance will be. Also, the narrower the width of the path, the higher the resistance will be.

As described above, the trend toward higher operational frequencies, and the resulting decreases in skin depth tends to make the plates of a capacitor more resistive. In addition, the use of certain high-K dielectric materials and conductors other than copper or aluminum is also leading to increases in the resistance of capacitor plates.

As certain high-K dielectric materials are not compatible with the most conductive metals such as copper and aluminum, the use of lower conductivity metals in capacitors having high-K dielectrics further increases the resistance. For example, while copper has a conductivity of $6.0\times10^7/\Omega.m$, platinum, which can be combined in capacitors having some types of high-K ferroelectric dielectrics, has conductivity of only $9.6\times10^6/\Omega.m$, only about one sixth that of copper.

Heretofore, little consideration has been given to the geometry of the interconnection between the plates of a capacitor and other elements in a way which reduces the equivalent series resistance of the capacitor. Because of the higher frequencies at which circuits now operate, not only in chips, but in packaging and circuit panel elements as well, and the more lossy (resistive) types of materials used in capacitors, the resistance of a capacitor has become significant relative to the capacitance, such that a new way is needed to lower the equivalent series resistance.

The failure of the prior art to address this concern is best explained with reference to the example shown in FIGS. 2A and 2B. Conventionally, as shown in the plan view of FIG. 2A and the cross-sectional view through lines 2B—2B thereof in FIG. 2B, a capacitor 18 having two plates 20 separated by a capacitor dielectric 22 is coupled to other circuit elements through a conductor, which is formed as a central post 24 in the center of plate 20, as shown in FIGS. 2A–2B. The other plate 20 of the capacitor may either be connected to other circuit elements through another central post 26, or the plate 20 may coincide with a ground plane, or, alternatively, the plane of a power supply.

As noted above, the resistance of a current path is directly related to the ratio of the length to width of the path in which the current is conducted. Thus, as shown in FIGS. 2A–2B, in a capacitor having square plates 20 measuring two units on a side, the distance that currents cross from the central post 24 to a north or south edge 28 of the plate is one unit, and from the central post 24 to the east or west edge 30 of the plate is also one unit. Such distance, being in the direction from an origin (the center post 24) to the edge (28 or 30), represents the length of the path, for purposes of determining the resistance. However, the distance from the center of the post 24 to the corners 32 of the plate 20 is not one unit, but rather $\sqrt{2}$. Thus, in the square plate capacitor 18 of FIGS. 2A and 2B, the current must travel a minimum length of one unit from the central post 24 to the edges 28 and 30, while a length of up to $\sqrt{2}$ may have to be crossed to reach the corners of the capacitor plate 20.

One possible way of reducing the path length would be to form the capacitor plates as circular disks 34, as shown in FIG. 3, such that the length of the distance the current crosses from a central post 36 to the edge 38 would be uniformly one unit. However, such shape might not be easily provided in an integrated circuit, packaging element or circuit panel, as processing is generally optimized for the formation of generally rectangular circuit elements rather than circular elements. In addition, the space within a rectangular region 40 surrounding the capacitor 34 might end up being wasted. Thus, disk geometry does not solve the above problem in a satisfactory way.

The second factor, width of the path of the current must also be considered, since resistance is inversely related to the width. In this context, the width is the dimension through which the current passes at one time. With reference to FIG. 2A, although the plate capacitor 20 has square shape, the direction of current flow is radially outward from the central post 24. Thus, the width of the current path at any point in time is the circumference of a circle having a radius 42 equal to the distance from the center of the central post 24. As the distance from the center increases, the width increases by a factor of $2\pi$. Consequently, when a central post 24 is used that is relatively small in relation to the size of the capacitor plate 20 (e.g. 1/10), the resistance will be many times higher near the central post 24 than near the edges 28, 30 of the plate 20. Accordingly, the width of the central post 24 that interconnects the capacitor 18 to other circuitry becomes a limiting factor in reducing the series resistance of the capacitor 18.

For these and other reasons, therefore, there has been an increasing need for a capacitor design which will mitigate the effects of resistivity, particularly in high-frequency operation.

SUMMARY OF THE INVENTION

According to an aspect of the invention, a structure and method are provided for reducing the equivalent series resistance of a capacitor.

According to an aspect of the invention, a capacitor includes one or more conductive interconnections contacting an active region of a first conductive plate of the capacitor at a plurality of locations along a lengthwise direction, such that every portion of the active region of the first conductive plate lies within a maximum distance from one of the locations, the maximum distance being less than the lateral dimension of the active region.

According to another aspect of the invention, a capacitor includes:

(a) first and second conductive plates; and (b) a dielectric layer, the first and second conductive plates being arranged so that the first conductive plate has an active region aligned with the second conductive plate and said dielectric layer lies between the active region of the first conductive plate and the second conductive plate, the active region of the first conductive plate being elongated, having a lengthwise direction and having a length in the lengthwise direction, and having a lateral direction transverse to the lengthwise direction and having a lateral dimension in the lateral direction which is less than the length; and (c) one or more conductive interconnections, each having a lateral dimension in the lateral direction which is less than the lateral dimension of the active region, the one or more conductive interconnections each contacting the first conductive plate at a plurality of locations along the lengthwise direction, such that every portion of the active region of the first conductive plate lies within a maximum distance from one of the locations, the maximum distance being less than the lateral dimension of the active region.

According to another aspect of the invention, a capacitor includes:

(a) first and second conductive plates; and (b) a dielectric layer, the first and second conductive plates being arranged so that the first conductive plate has an active region aligned with the second conductive plate and the dielectric layer lies between the active region of the first conductive plate and the second conductive plate, the active region having a lengthwise direction and having a length in the lengthwise direction; and (c) a plurality of conductive interconnections extending in the lengthwise direction and contacting the first conductive plate at a plurality of locations along the lengthwise direction so that every portion of the active region of the first conductive plate lies within a maximum distance from at least one of the locations, the maximum distance being less than one-half of the length of the active region.

According to another aspect of the invention, a method of making a capacitor includes:

forming a first conductive plate;

forming a dielectric layer contacting the first conductive plate;

forming a second conductive plate contacting the dielectric layer, the first and second conductive plates being arranged so that the first conductive plate has an active region aligned with the second conductive plate and the dielectric layer lies between the active region of the first conductive plate and the second conductive plate, the active region of the first conductive plate being elongated, having a lengthwise direction and having a length in the lengthwise direction, and having a lateral direction transverse to the lengthwise direction and having a lateral dimension in the lateral direction which is less than the length; and forming one or more conductive interconnections, each having a lateral dimension in the lateral direction which is less than the lateral dimension of the active region, the one or more conductive interconnections each contacting the first conductive plate at a plurality of locations along the lengthwise direction, such that every portion of the active region of the first conductive plate lies within a maximum distance from one of the locations, the maximum distance being less than the lateral dimension of the active region.

BRIEF DESCRIPTION OF THE DRAWINGS

FIGS. 4–5A are a plan view and a perspective view, respectively, illustrating a capacitor according to an embodiment of the invention.

FIG. 6A is a plan view illustrating a capacitor according to another embodiment of the invention.

FIGS. 6B and 6C are plan views each illustrating a capacitor according alternative versions of further embodiments of the invention.

DETAILED DESCRIPTION

Figure 4:
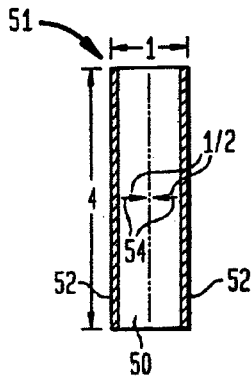
Figure 5A:
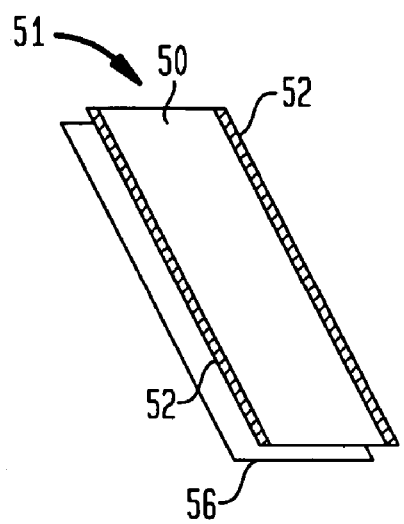

The plan view of FIG. 4 and the perspective view of FIG. 5A illustrate an embodiment of the invention. As shown in FIGS. 4 and 5A, a conductive plate 50 of a capacitor 51 has an elongated shape measuring four units by one unit. Thus, the conductive plate 50 has a length of four in a lengthwise direction and a lateral dimension of one in a lateral direction which is transverse to the lengthwise direction. the conductive plate 50 is contacted by a plurality of conductive interconnections 52 arranged in a manner to decrease the equivalent series resistance across the plate 50 between the conductive interconnections 52. As shown in this embodiment, the capacitor plate 50 having these dimensions has the same area as the two by two square plate capacitor shown in FIGS. 2A–2B.

An active region of the conductive plate 50 is defined as the portion of the plate 50 which is capacitively coupled to the opposite plate 56. Thus, the active region includes all of the conductive plate 50 except the portions which extend beyond the dimensions of the opposite plate 56. In this case, the active region is coextensive with the conductive plate 50. The capacitor 51 has much less equivalent series resistance from the conductive interconnections 52 to locations across the plate than the plate capacitor shown in FIGS. 2A–2B, since the width of the current path across the capacitor plate 50 is greatly increased, while the length of the current path is reduced. Note that the length of the current path across the plate depends on the locations of the conductive interconnections 52 in relation to the plate 50. It is not to be confused with the length of the active region (four units) of the plate 50 which denotes the extent of the active region of the plate 50 itself in a lengthwise direction. As is apparent from an examination of FIGS. 4–5A, the conductive interconnections 52 are placed at such locations that every portion of the active region (four units) of the plate 50 lies within a maximum distance from a location of a conductive interconnection 52, that distance being less than the lateral dimension of the active region, i.e., one unit.

Figure 1:
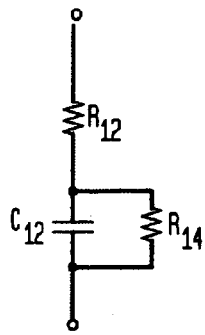
FIG. 1 is a schematic diagram illustrating a circuit equivalent for a capacitor.
Figure 2A:
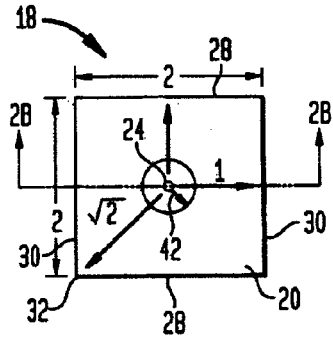
FIGS. 2A and 2B are a plan view, and a cross-sectional view, respectively, illustrating a conventional capacitor.
Figure 2B:
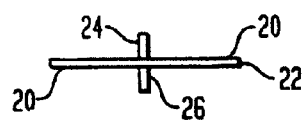
Figure 3:
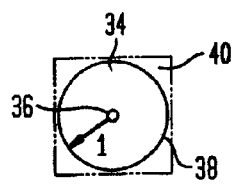
FIG. 3 is a plan view illustrating a conventional capacitor.

In the plate capacitor shown in FIG. 2A the width of the current path is $2\pi$ times the distance from the center of the conductor post 24. The width of the conductor post 24 is far less than one, e.g. a value of about 0.05 or 0.1. Thus, by the relation $R=Rs \times (L/W)$, the plate 20 of the prior art capacitor shown in FIG. 2A appears significantly more resistive at the beginning of the current path than near the end of the current path, such that high series resistance of the plate is encountered at the beginning of the current path. By contrast, in the embodiment of FIG. 4, the width of the current path 54 starts and ends as the same value i.e., four, which is also the length of the plate 50.

In addition, in the plate capacitor 51 having two conductive interconnections 52 formed along edges of the long sides, two current paths 54 exist in parallel, each having a length of one half unit from the conductive interconnections 52 to the centerline of the capacitor plate 50 where the currents from each path meet each other. Therefore, each current path 54 effectively ends where it meets the other current path, since by the time that the currents meet, currents from both paths have spread over the entire capacitor 51. Accordingly, comparing the embodiment shown in FIG. 4 to that of FIG. 2A, the maximum length of the current path is reduced from a value of $\sqrt{2}$ in the capacitor of FIG. 2A to a value of one half in the embodiment shown in FIG. 4.

Preferably, the metals used to form the conductive interconnections also have lower resistivity than the materials of which the capacitor is fabricated. For example, conductive interconnections comprised of high conductivity metals such as copper and/or aluminum can be used together with an appropriate intervening barrier material, if needed, to connect to a capacitor plate of lower conductivity material such as platinum, silicide compound, or doped polysilicon, etc.

Figure 5B:
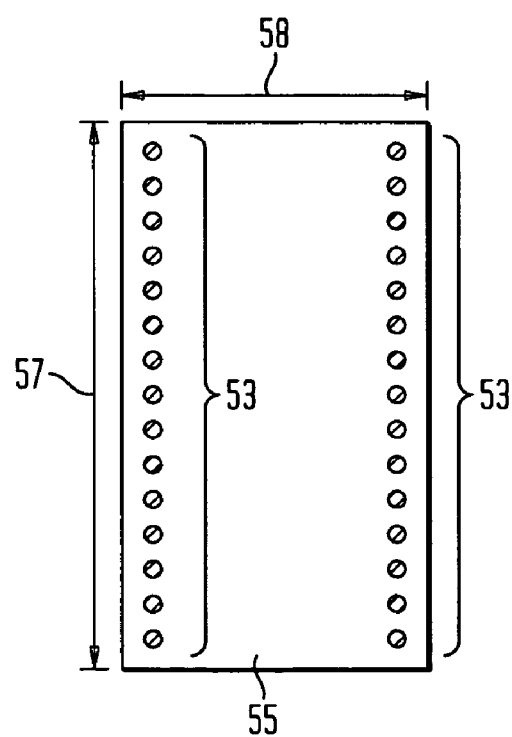
FIG. 5B is a plan view illustrating a capacitor according to an alternative version of the embodiment of the invention shown in FIGS. 4–5A.

FIG. 5B is a plan view illustrating an alternative version of the embodiment shown and described above relative to FIGS. 4–5A. In this embodiment, a plurality of conductive interconnections 53 contact an active region of a capacitor plate 55 at multiple locations extending in a lengthwise direction 57 of the capacitor plate 55. In this embodiment, the conductive interconnections 53 differ from those shown in FIGS. 4–5A in that they are formed as a plurality of discrete contacts rather than strips that run continuously in a lengthwise direction of the active region. As in the above-described embodiment, every portion of the active region lies within a maximum distance from a location of a conductive interconnection 53, that distance being less than the lateral dimension 58 of the active region.

FIG. 6A illustrates another embodiment of the invention, similar to the embodiment shown in FIGS. 4 and 5A, but in which conductive interconnections 62 are placed at intervals midway between the centerline 64 and the lengthwise running edges 66 of the plate 60. As in the above-described embodiment shown in FIGS. 4–5A, the active region is coextensive with the dimensions of the plate 60. With such placement, it is apparent that the length of the current path 65 from each conductive interconnection 62 outward is one quarter unit, including the current paths 65 from both conductive interconnections which meet at the centerline 64. Another advantage of the embodiment of FIG. 6A is that the width of the current paths 65 from each conductive interconnection 62 outward is effectively doubled over those shown in FIGS. 4–5A, because there are two parallel current paths 65 extending from each conductive interconnection 62 outward, one in the direction towards the edge 66 of the plate 60, and the other in the direction towards the centerline 64. Considering that the length of each current path 65 is halved, and the width of each current path is effectively doubled, the ESR of the capacitor embodiment shown in FIG. 6A has therefore been reduced by a factor of about four from the ESR of the embodiment shown in FIGS. 4–5A.

FIG. 6B is a plan view illustrating a capacitor 71 according to an embodiment of the invention. In this embodiment, similar to the embodiment shown in FIG. 6A, an active region of a capacitor plate 70 is elongated, having a length 73, e.g. four units, in a lengthwise direction, and a lateral dimension 75, e.g. one unit, in a lateral direction which is transverse to the lengthwise direction.

A single conductive interconnection is formed as a conductive strip 72 extending in the lengthwise direction to contact multiple locations of the active region of a capacitor plate 70. The conductive strip 72 is preferably formed of a metal that is more conductive than the material of the capacitor plate 70 at operational frequencies of interest for the capacitor. The conductive strip 72 has a lateral dimension 76 that is less than, and which can be several times less than, the lateral dimension 75 of the active region of the capacitor plate 70. As in the embodiments described above relative to FIGS. 4–5B, the conductive strip 72 is located in relation to the active region in such a way that every portion of the active region lies within a maximum distance of a location of the conductive strip 72, the maximum distance being less than the lateral dimension 75 of the active region.

FIG. 6C is a plan view illustrating a capacitor according to another embodiment of the invention. In this embodiment, similar to the embodiment shown in FIG. 6B, an active region 77 of a capacitor plate is elongated, having a length 67, e.g. four units, in a lengthwise direction, and a lateral dimension 68, e.g. one unit, in a lateral direction which is transverse to the lengthwise direction.

Unlike the single continuous conductive strip 72 shown in FIG. 6B, in this embodiment, a conductive interconnection 78 includes a plurality of discrete contacts. As in the embodiment of FIG. 6B, the conductive interconnection 78 is located in relation to the active region 77 in such a way that every portion of the active region lies within a maximum distance of a location of the conductive interconnection, the maximum distance being less than the lateral dimension 68 of the active region.

Figure 7:
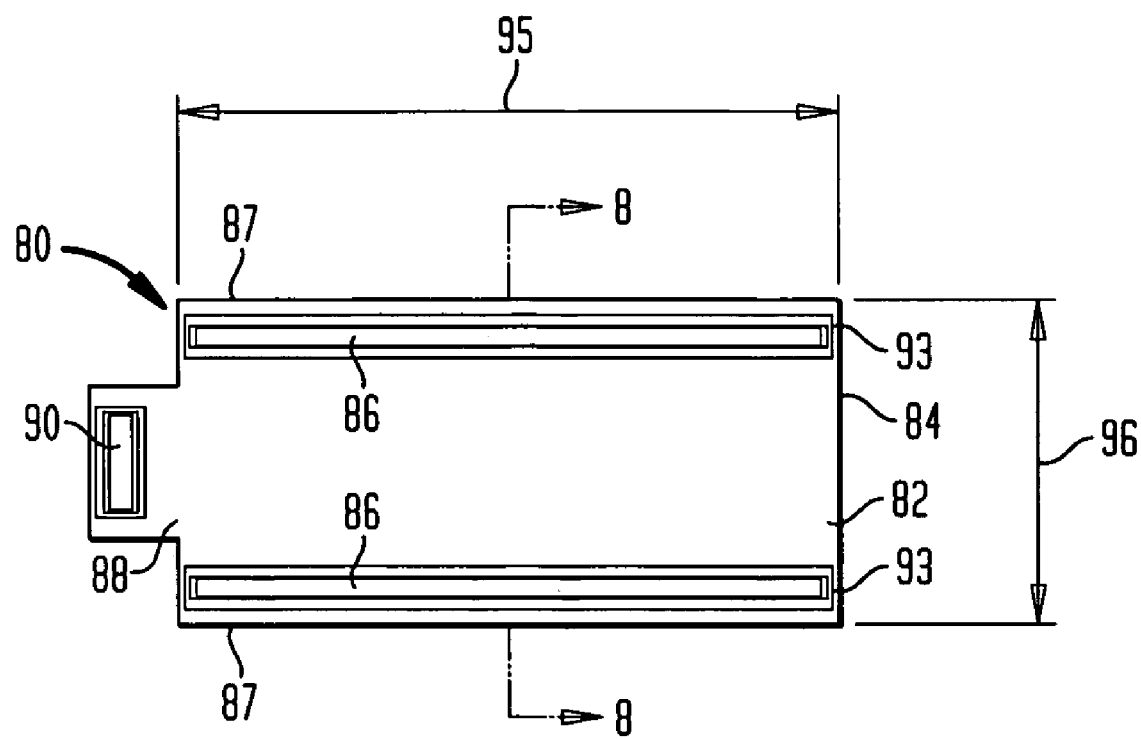
FIG. 7 is a plan view illustrating a capacitor according to yet another embodiment of the invention.
Figure 8:
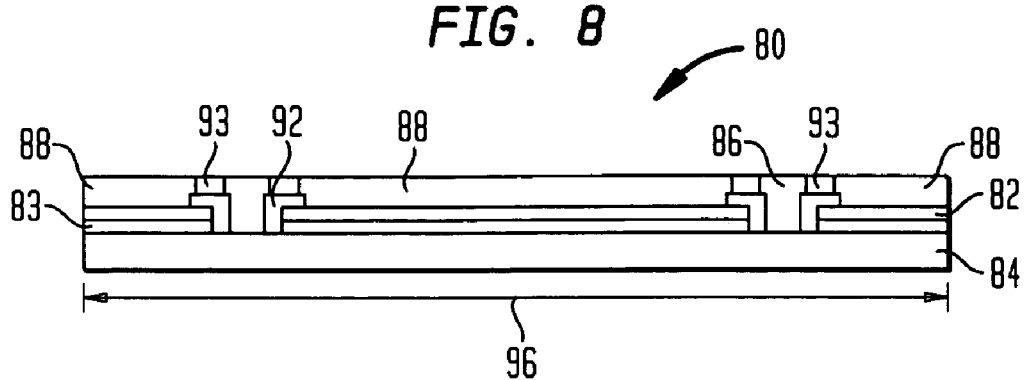
FIG. 8 is a cross-sectional view through lines 8—8 of the capacitor according to the embodiment of the invention shown in FIG. 7.

FIGS. 7 and 8 are a plan view and a cross-sectional view, respectively, illustrating another embodiment of the invention in which a conductive interconnection 88 to a top plate 82 and conductive interconnections 86 to a bottom plate 84 of a capacitor 80 are both made from a top side (the side on which the top plate 82 is located) of the capacitor 80. As shown in FIGS. 7 and 8, conductive interconnections include elongated interconnections 86 located near the edges 87 of the long sides of the capacitor 80. These conductive interconnections 86 extend vertically from a top surface of the capacitor 80 to the bottom plate 84 and contact the bottom plate 84 at a plurality of locations in the lengthwise direction 95 of the bottom plate 84. In this way, any location of the bottom plate 84 is within a maximum distance from one or the other conductive interconnection 86, the maximum distance being less than the lateral dimension 96 of the bottom plate 84, i.e., the dimension in the direction transverse to the lengthwise dimension 95.

As shown in FIGS. 7 and 8, in order to provide all conductive interconnections from a top side of capacitor 80 to the bottom plate 84, it is necessary to isolate the conductive interconnections from each other. This is accomplished through use of a patterned dielectric 93 which insulates the conductive interconnections 86 from the conductive interconnections 88.

Figure 9:
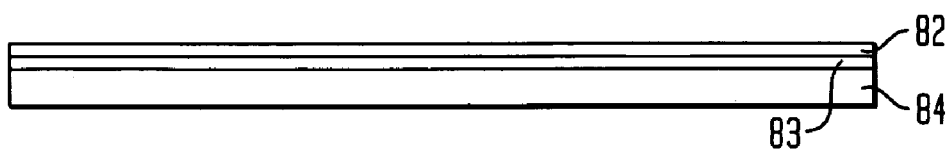
FIGS. 9–12 are diagrams illustrating a process of making a capacitor according to the embodiment of the invention shown in FIGS. 7–8.

An illustrative method of making a capacitor 80 having the above-described conductive interconnections is further described with reference to FIGS. 8 through 12. As shown in FIG. 9, a capacitor stack is provided having a bottom plate 84, over which a capacitor dielectric 83 is formed, over which, in turn, a top plate 82 is formed. Illustrative methods of forming the capacitor stack include depositing, or alternatively patterning a first layer of metal, heavily doped semiconductor or silicide compound for forming the bottom plate 84. In a preferred embodiment, the bottom plate 84 of the capacitor 80 is formed as a relatively thick layer, such as can be provided if processing begins with a metal layer in order to provide structural support for the capacitor 80. Thereafter, a capacitor dielectric 83 is deposited onto the bottom plate 84, or alternatively, grown as a native oxide, nitride, or other dielectric compound of the material of the bottom electrode by exposure to oxygen, or nitrogen, etc., respectively, under conditions, e.g. elevated temperature, which are favorable to controlled growth of the dielectric. Thereafter, the top plate 82 is formed over the capacitor dielectric 83, as by deposition of a compatible metal or heavily doped semiconductor material.

As an alternative to the above-described process, the top plate 82 can be formed first by a process such as that described above for the bottom plate 84, then the capacitor dielectric 83 be formed thereafter, and then the bottom plate 84 can be formed after the top plate 82 and the capacitor dielectric 83 are formed.

Figure 10:
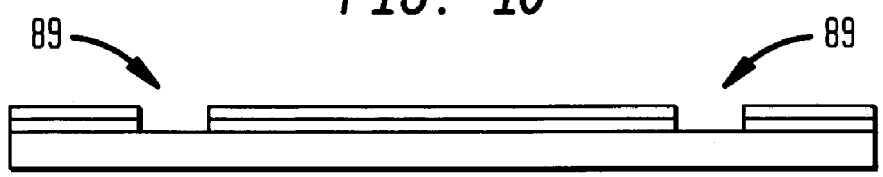

Thereafter, as shown in FIG. 10, a plurality of troughs 89 are formed extending through the top plate 82 and dielectric layer 83 to expose the bottom plate 84. The troughs 89 are illustratively formed by etching exposed areas according to a photolithographic resist pattern. The troughs 89 extend in a lengthwise direction 95 near the long edges 87 (FIG. 7) of the capacitor 80 to lengths at least as long or greater than the lengths of the conductive interconnections 86 which will be formed therein.

Figure 11:
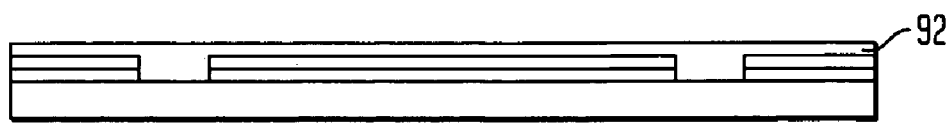

Thereafter, as shown in FIG. 11, an insulating dielectric 92 is deposited over the structure. Such insulating dielectric 92 need not entirely fill troughs 89 or even be a particularly good insulator in areas where it contacts the exposed top plate 82 because, as will be described relative to FIG. 12, the insulating dielectric 92 is thereafter removed from such areas. It suffices if the insulating dielectric 92 has adequate insulating properties where it contacts the edges of the troughs 89.

Figure 12:
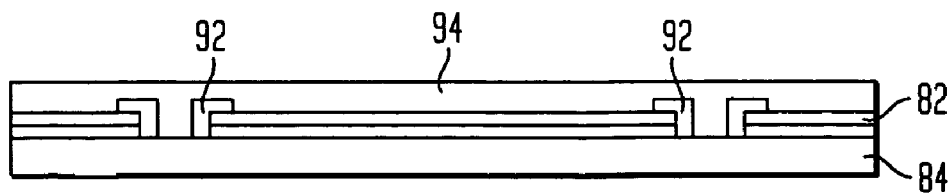

Thereafter, as shown in FIG. 12, the insulating dielectric 92 is removed from the top plate 82 and the bottom plate 84 in all areas except near the sidewalls of the troughs 89. As also shown in FIG. 12, a conductive interconnect metal 94 is deposited over the structure, after the insulating dielectric patterns 92 have been formed on edges of the troughs 89. Thereafter, as shown in FIG. 8, the conductive interconnect metal 94 is patterned, as by etching to a photolithographic resist pattern, to form gaps in the metal layer 94 above the dielectric patterns 92, which gaps are then preferably filled with a dielectric 93 to insulate the side conductive interconnections 86 from the central conductive interconnection 88 which is formed from the same conductive interconnect metal pattern 94. With reference to FIG. 7, a further conductive interconnection 90 to the central conductive interconnection can be made by depositing one or more additional metals, e.g. metals for forming a solderable connection such as nickel (a barrier material), gold (for corrosion resistance), and thereafter a low-melting point metal such as tin, solder, zinc, or lead or a combination thereof to facilitate joining of the capacitor 80 to other elements.

Figure 13A:
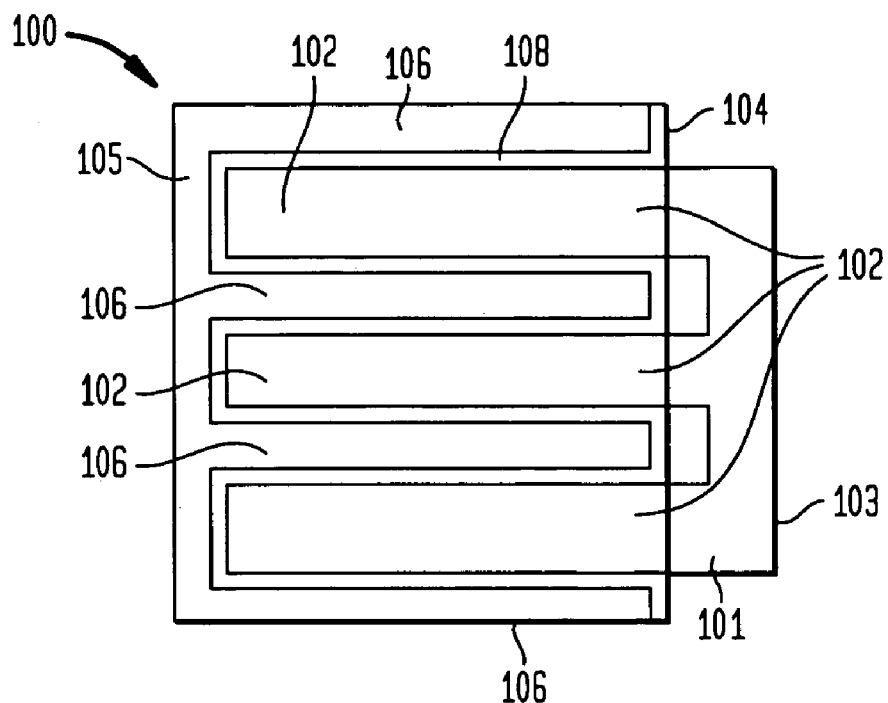
FIG. 13A is a plan view illustrating a multiple finger capacitor according to an embodiment of the invention.

FIG. 13A illustrates another embodiment of the invention in which a top plate 101 of a capacitor 100 is provided with a plurality of fingers 102 which operate essentially as parallel-connected capacitors. Stated another way, fingers 102 define the lengths and lateral dimensions of the active regions of parallel-connected capacitors which are located where the fingers 102 of the top plate 101 are capacitively coupled to the bottom plate 104 by a capacitor dielectric layer lying therebetween (not shown). Parallel-connected capacitors have a capacitance which is equal to the sum of the capacitances of each capacitor. Thus, the total capacitance provided by the capacitor 100 shown in FIG. 13A is equal to the sum of the capacitances of the active region of each finger 102 of the capacitor. While the top plate 101 of the capacitor is provided as multiple parallel-connected fingers 102, the bottom plate 104 of the capacitor can be an uninterrupted surface extending under all fingers 102 as a common plate of the capacitor 100.

As it is desirable to provide conductive interconnections to both the top plate 101 and the bottom plate 104 from the top side of the capacitor, a conductive interconnect metal layer 105 having a plurality of elongated fingers 106 oriented in the same direction as fingers 102 of the top plate, is formed extending from the top side, through etched openings in the capacitor dielectric (not shown) to the bottom plate 104 of the capacitor. The fingers 106 of the conductive interconnection to the bottom plate 104 extend along the length of each of the parallel finger capacitors which are present between the fingers 102 of the top plate and the bottom plate 104. An insulating dielectric 108 separates the fingers 102 of the top plate and the conductive interconnection 105 to the bottom plate 104 including the fingers 106, to prevent shorting and other unwanted interaction. The conductive interconnection 105 and the fingers 106 are desirably formed to a greater height from the bottom plate 104 than the top plate 101 and fingers 102 so as to permit the parallel application of a potential thereto from the top side of the capacitor. Such potential may be a signal potential, voltage supply potential or ground. Likewise, structure is provided to facilitate the conductive interconnection of the top plate 101 including fingers 102 to a desired potential from the top side of the capacitor 100. Thus, for that purpose, the top plate 101 is preferably formed having a portion 103 extending beyond the bottom plate 104 of the capacitor 100.

Figure 13B:
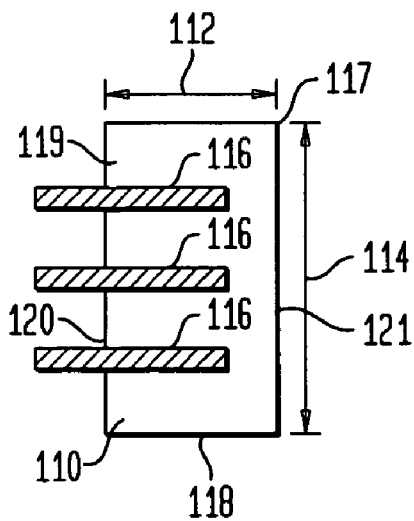
FIGS. 13B–13E are plan views each illustrating a capacitor according to further embodiments of the invention in which a plurality of conductive interconnections contact a first conductive plate of the capacitor.

FIG. 13B is a plan view illustrating a capacitor according to another embodiment of the invention. In this embodiment, a first capacitor plate 110 has an active region which is uninterrupted over an area having a length 112 in a lengthwise direction, and having a lateral dimension 114 in a lateral direction transverse thereto. The active region is the area of the first capacitor plate 110 which is capacitively coupled to the second capacitor plate (not shown) opposed thereto. Multiple conductive interconnections 116 contact the active region of the first capacitor plate 110 at multiple locations lying in the lengthwise direction of the active region. In the embodiment shown in FIG. 13B, each conductive interconnection 116 extends continuously over multiple locations of the first capacitor plate 110 that lie along a lengthwise direction of the active region.

The conductive interconnections 116 are also located in a way such that wide short current paths are provided for current to flow to and from the conductive interconnections across the active region of the first conductive plate 110. Accordingly, the conductive interconnections 116 are located such that every portion of the active region of the first capacitor plate 110 lies within a maximum distance from at least one of the locations of the conductive interconnections. In a preferred embodiment, to assure that the paths for current across the first capacitor plate 110 remain short from the multiple conductive interconnections, it is preferred that the maximum distance between every portion of the active region and a location of a conductive interconnection be no more than half the length 112 of the active region. This criterion is met by the conductive interconnections 116 shown in FIG. 13A, as corners, e.g. 117, edges, e.g. 118 and other locations, e.g. 119 of the active region 110 are all located within a distance of no more than half the length 112 of the active region from the nearest point of intersection with at least one of the conductive interconnections 116.

In the embodiment shown in FIG. 13B, conductive interconnections 116 extend from a first edge 120 of the first capacitor plate 110 over locations of the active region to locations that are within the maximum distance of the second, opposite edge 121 of the first capacitor plate 110. Optionally, the conductive interconnections 116 may extend from locations at or near the first edge 120 to locations that contact the opposite edge 121.

Figure 13C:
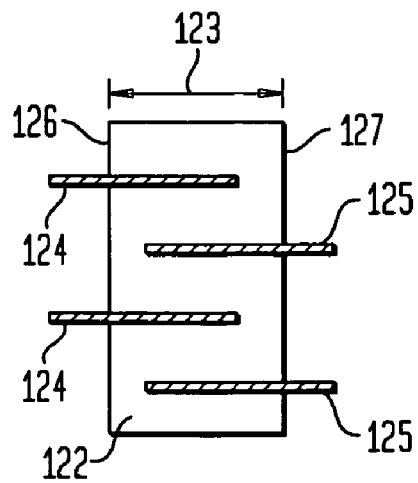

FIG. 13C is a plan view illustrating a capacitor according to another embodiment of the invention. In this embodiment, similar to that shown in FIG. 13B, the active region of the first conductive plate 122 is uninterrupted over an area having a length 123 in a lengthwise direction. As in the embodiment shown in FIG. 13B, multiple conductive interconnections 124, 125 contact locations extending in a lengthwise direction of the active region of a first capacitor plate 122. However, some conductive interconnections 124 extend from a first edge 126 and, therefore, contact only the first edge 126 of the active region, while other conductive interconnections 125 extend from a second edge 127, and therefore, contact only the second edge 127 of the active region. As in the embodiment shown in FIG. 13B, the conductive interconnections 124, 125 are preferably located in such a way that every portion of the active region lies within a maximum distance of a location of a conductive interconnection 124 or 125, the maximum distance being one half of the length 123 of the active region of the first capacitor plate 122.

Figure 13D:
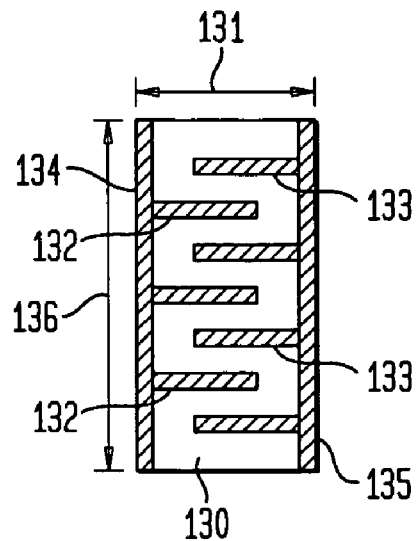

FIG. 13D is a plan view illustrating a capacitor according to another embodiment of the invention. In this embodiment, similar to that shown in FIG. 13C, the active region of a first conductive plate 130 is uninterrupted over an area having a length 131 in a lengthwise direction. As in the embodiment shown in FIG. 13C, multiple conductive interconnections 132, 133 extend in a lengthwise direction of the active region of the first capacitor plate 130. In addition to the lengthwise extending conductive interconnections 132, 133, additional conductive interconnections 134, and 135 are provided, which extend in a lateral direction 136 transverse to the lengthwise direction along edges of the active region. Placement along the edges is desirable to facilitate further interconnection of the conductive interconnections 134, 135 to other elements. However, in an alternative embodiment, it may be desirable to locate the conductive interconnections 134, 135 away from the edges, i.e. towards the interior of the first capacitor plate 130, in order to further decrease the resistance across the active region of the first capacitor plate 130, in a manner similar to the embodiment described above relative to FIG. 6A.

Figure 13E:
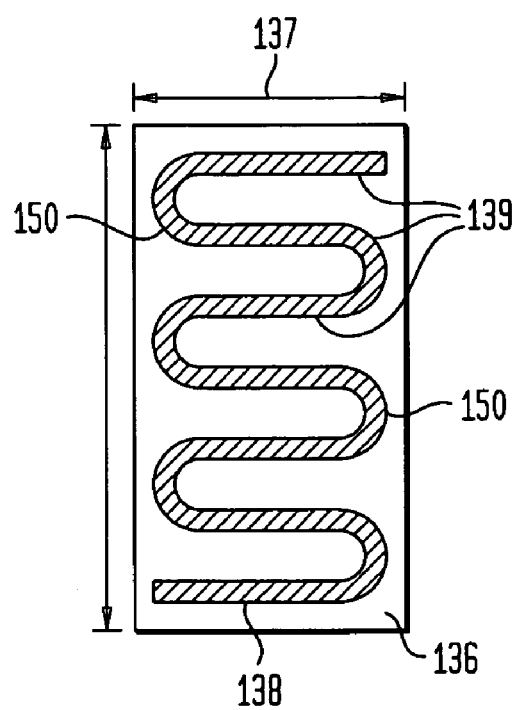

FIG. 13E is a plan view illustrating a capacitor according to another embodiment of the invention. In this embodiment, similar to that shown in FIG. 13C, the active region of the first conductive plate 136 is uninterrupted over an area having a length 137 in a lengthwise direction. In this embodiment, a conductive interconnection 138 having a serpentine shape contacts multiple locations of the active region of the first conductive plate 136. Similar to the embodiments described above relative to FIGS. 13B through 13D, the conductive interconnection 138 includes a plurality of portions 139 which extend in a lengthwise direction of the active region of the first capacitor plate 136. One or more curved connection portions 150 connect the lengthwise extending portions 139. In this embodiment, as in the embodiments described above relative to FIGS. 13B through 13D, the portions 139 and 150 of the conductive interconnection 138 are preferably located in relation to the active region and to each other in such a way that every portion of the active region lies within a maximum distance of one half the length 137 of the active region from a location of the conductive interconnection 138. In this way, the path lengths for currents across the active region of the first capacitor plate 136 are preferably kept to a maximum of one half the length 137 of the active region.

Figure 14:
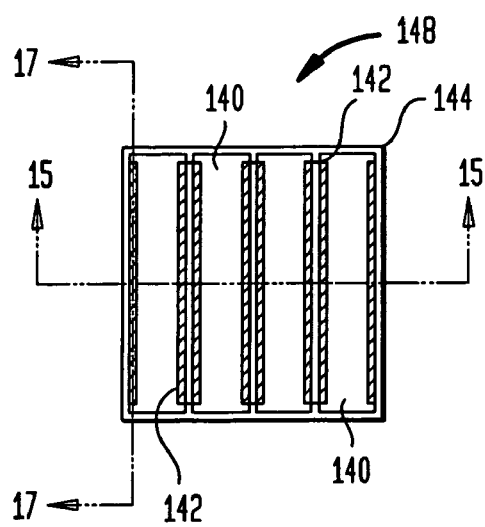
FIGS. 14 and 15 are a plan view, and a cross-sectional view thereof through lines 15—15, respectively, illustrating a multiple finger capacitor according to another embodiment of the invention.
Figure 15:
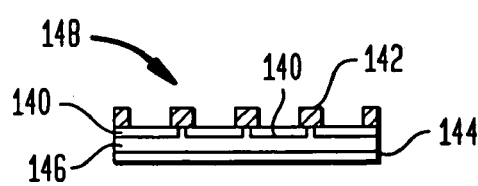

FIGS. 14 and 15 illustrate another embodiment of the invention in which multiple parallel-connected elongated capacitors 140 are provided, each of which includes a bottom capacitor plate 144, and capacitor dielectric 146 therebetween. In this embodiment, multiple low-resistance conductive interconnections 142 are provided which extend along the long edges of each capacitor 140. In addition, as shown, a conductive interconnection 142 can contact more than one elongated capacitor 140 along adjoining long edges of capacitors 140. In such way, the equivalent series resistance of each top plate of each elongated capacitor 140 is reduced in the manner described above with reference to FIG. 4.

Figure 16:
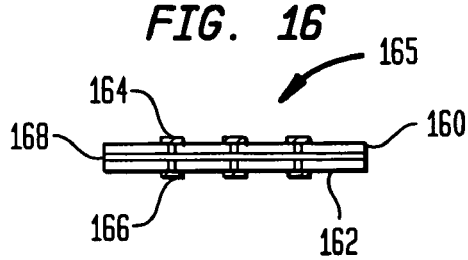
FIG. 16 is a cross-sectional view illustrating a multiple finger capacitor according to a yet another embodiment of the invention.

FIG. 16 illustrates an alternative version of the embodiment shown in FIGS. 14 and 15, in which both the top plate 160 and the bottom plate 162, spaced therefrom by the capacitor dielectric 168, are provided as multiple elongated fingers, over which the conductive interconnections 164 and 166 are provided along edges of each finger, in like manner to that shown for interconnections 142 in FIGS. 14–15.

Figure 17:
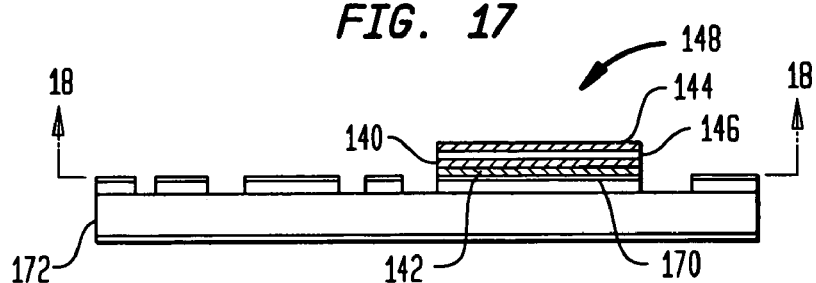
FIGS. 17 and 18 are a cross-sectional view, and a plan view through lines 18—18, respectively, illustrating a capacitor according to an embodiment of the invention, as interconnected to a circuit panel.
Figure 18:
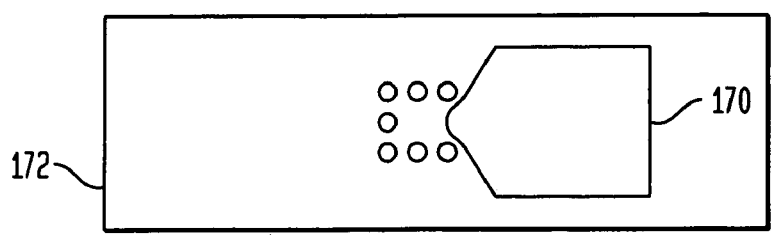

FIGS. 17 and 18 illustrate an exemplary interconnection of a capacitor formed according to the embodiments described herein. FIG. 17 is a cross-sectional view illustrating the interconnection of the multiple-fingered capacitor 148 (FIGS. 14–15) to a circuit panel 172, e.g. a printed wiring board, or flexible membrane provided with conductor patterns. As shown in FIG. 17, the capacitor 148 is mounted top side down such that the conductive interconnection 142 to each finger 140 is conductively connected to a metal base pattern 170 of the circuit panel 172. In such case, the uninterrupted bottom plate 144 of the capacitor is exposed after mounting. This uninterrupted bottom plate 144 can be connected to other conductive elements of the circuit panel by conventional techniques as, for example, by wire bonding.

In the structure of FIGS. 14 and 15, and in the structure of FIGS. 17 and 18, only one plate is provided with conductive interconnections arranged to reduce the effects of resistance, whereas the opposite plate is not provided with such interconnections. This arrangement can be used, for example, where one plate is formed from a material having relatively low sheet resistance at the operating frequency and the opposite plate is formed from a material having higher sheet resistance at the operating frequency. The plate having higher sheet resistance desirably is provided with the conductive interconnections.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A capacitor comprising:
   (a) first and second conductive plates; and
   (b) a dielectric layer, said first and second conductive plates being arranged so that said first conductive plate has an active region aligned with said second conductive plate and said dielectric layer lies between said active region of said first conductive plate and said second conductive plate, said active region of said first conductive plate being elongated, having a lengthwise direction and having a length in said lengthwise direction, and having a lateral direction transverse to said lengthwise direction and having a lateral dimension in said lateral direction which is less than said length; and
   (c) one or more conductive interconnections, each having a lateral dimension in said lateral direction which is less than said lateral dimension of said active region, said one or more conductive interconnections each contacting said first conductive plate at a plurality of locations along said lengthwise direction, such that every portion of said active region of said first conductive plate lies within a maximum distance from one of said locations, said maximum distance being less than said lateral dimension of said active region, wherein said first conductive plate has a first sheet resistance and each said conductive interconnection has a second sheet resistance that is lower than said first sheet resistance at operational frequencies of interest.

2. A capacitor as claimed in claim 1, wherein said operational frequencies of interest include radio frequencies.

3. A capacitor as claimed in claim 2, wherein said active region of said first conductive plate includes a pair of opposed edges spaced apart from each other in said lateral direction and said one or more conductive interconnections includes a pair of conductive strips extending continuously along portions of said opposed edges in said lengthwise direction.

4. A capacitor as claimed in claim 2, wherein said active region of said first conductive plate includes a pair of opposed edges spaced apart from each other in said lateral direction and said one or more conductive interconnections includes a pair of conductive strips extending continuously in said lengthwise direction over locations of said active region between said opposed edges.

5. A capacitor as claimed in claim 4, wherein said pair of conductive strips are each located a distance of one quarter of said lateral dimension from respective ones of said opposed edges.

6. A capacitor as claimed in claim 1, wherein each of said one or more conductive interconnections includes a plurality of contacts to discrete locations extending along a line.

7. A capacitor as claimed in claim 6, wherein said active region of said first conductive plate includes first and second opposed edges spaced apart from each other in said lateral direction and said one or more conductive interconnections includes first and second conductive interconnections extending along said first and second opposed edges, respectively.

8. A capacitor as claimed in claim 1, wherein said one or more conductive interconnections consists of a plurality of contacts to discrete locations along a single line.

9. A capacitor as claimed in claim 8, wherein said active region of said first conductive plate includes a pair of opposed edges spaced apart from each other in said lateral direction and said single line is centered between said opposed edges.

10. A capacitor as claimed in claim 1, wherein said one or more conductive interconnections consists of a single elongated conductive strip extending continuously in said lengthwise direction over locations of said active region.

11. The capacitor as claimed in claim 1, wherein said active region further has a direction of thickness which is substantially perpendicular to said lengthwise direction and said lateral direction, and a conductive interconnection of said one or more conductive interconnections extends in said direction of thickness to said first conductive plate from a side of said capacitor on which said second conductive plate is located.

12. A capacitor comprising:
(a) first and second conductive plates; and
(b) a dielectric layer, said first and second conductive plates being arranged so that said first conductive plate has an active region aligned with said second conductive plate and said dielectric layer lies between said active region of said first conductive plate and said second conductive plate, said active region having a lengthwise direction and having a length in said lengthwise direction; and
(c) a plurality of conductive interconnections extending in said lengthwise direction and contacting said first conductive plate at a plurality of locations along said lengthwise direction so that every portion of said active region of said first conductive plate lies within a maximum distance from at least one of said locations, said maximum distance being less than one-half of said length of said active region.

13. A capacitor as claimed in claim 12, wherein said active region has a lateral direction transverse to said lengthwise direction and has a lateral dimension in said lateral direction which is greater than said length, and said plurality of conductive interconnections are spaced apart from each other in said lateral direction, so that a maximum spacing in said lateral direction between adjacent ones of said conductive interconnections is less than said length.

14. A capacitor as claimed in claim 13, wherein said active region includes first and second opposed edges spaced apart from each other in said lengthwise direction, wherein each of said plurality of conductive interconnections extends from said first opposed edge.

15. A capacitor as claimed in claim 13, wherein said active region includes first and second opposed edges spaced apart from each other in said lengthwise direction, and said plurality of conductive interconnections includes a first set of conductive interconnections and a second set of conductive interconnections, wherein each conductive interconnection of said first set extends from said first opposed edge, and each conductive interconnection of said second set extends from said second opposed edge.

16. A capacitor as claimed in claim 15, wherein said plurality of conductive interconnections further includes first and second elongated conductive interconnections each extending in said lateral direction, said first elongated conductive interconnection being conductively connected to a plurality of said conductive interconnections of said first set, and said second elongated conductive interconnection being conductively connected to a plurality of said conductive interconnections of said second set.

17. A capacitor as claimed in claim 15, wherein each conductive interconnection of said first set is located adjacent to a conductive interconnection of said second set.

18. A capacitor as claimed in claim 12, wherein said one or more conductive interconnections includes a conductive interconnection having a serpentine shape including a plurality of generally parallel lengthwise portions contacting a plurality of locations extending in said lengthwise direction and at least one portion connecting said lengthwise portions.

* * * * *